United States Patent
Yamamoto et al.

(10) Patent No.: US 7,925,363 B2
(45) Date of Patent: Apr. 12, 2011

(54) ERROR-CORRECTION ASSISTANCE SYSTEM

(75) Inventors: Masayuki Yamamoto, Osaka (JP); Noriyoshi Nagata, Mie-Ken (JP)

(73) Assignee: Nitto Denko Corporation, Osaka (JP)

( * ) Notice: Subject to any disclaimer, the term of this patent is extended or adjusted under 35 U.S.C. 154(b) by 918 days.

(21) Appl. No.: 11/604,333

(22) Filed: Nov. 27, 2006

(65) Prior Publication Data
US 2007/0142952 A1 Jun. 21, 2007

(30) Foreign Application Priority Data
Dec. 19, 2005 (JP) .................. 2005-364917

(51) Int. Cl.
G05B 15/00 (2006.01)
G05B 11/01 (2006.01)
G06F 15/00 (2006.01)
G06F 3/048 (2006.01)
G06F 19/00 (2006.01)

(52) U.S. Cl. ............. 700/83; 700/17; 700/110; 715/272
(58) Field of Classification Search .................. 700/110, 700/17, 83; 715/772
See application file for complete search history.

(56) References Cited

U.S. PATENT DOCUMENTS

| | | | | |
|---|---|---|---|---|
| 5,319,353 A | * | 6/1994 | Ohnishi et al. | 340/525 |
| 5,774,759 A | * | 6/1998 | Tanaka | 399/8 |
| 6,665,267 B1 | * | 12/2003 | Iwasaki et al. | 370/241 |
| 7,684,064 B2 | * | 3/2010 | Kimura et al. | 358/1.14 |
| 2005/0126694 A1 | * | 6/2005 | Yamamoto | 156/247 |

FOREIGN PATENT DOCUMENTS

| | | | |
|---|---|---|---|
| JP | 06-52018 | * | 2/1994 |
| JP | 06-148251 | | 5/1994 |
| JP | 06-274222 | * | 9/1994 |
| JP | 2002-056476 | * | 2/2002 |
| JP | 2007-104451 | * | 4/2007 |

OTHER PUBLICATIONS ftp://207.18.56.26/software/BPG/bizhub600_750CopyOperUserManual.pdf, Minolta copier Machine Bizhub 600/750, Nov. 2005, pp. 1-37.*
SEMATECH "Strategic Cell Controller", 1996, pp. 1-218.*

* cited by examiner

Primary Examiner — Albert Decady
Assistant Examiner — Olvin Lopez
(74) Attorney, Agent, or Firm — Cheng Law Group, PLLC

(57) ABSTRACT

Upon detection of an error such as a malfunction occurring at a drive mechanism, a sensor transmits an error signal to a control section. The control section selects character information about details of the error corresponding to the error signal and an image representing the drive mechanism where the error occurs and a position of the sensor in the drive mechanism, and reads out the character information and the image from a storage part. Then, the control section allows a liquid crystal display device to display error information in which a first image of character information is combined with a second image of an error occurrence site in the drive mechanism. Then, error correction is sequentially performed in accordance with details of an error displayed as an uppermost layer on a screen.

7 Claims, 7 Drawing Sheets

ERROR-CORRECTION ASSISTANCE SYSTEM

BACKGROUND OF THE INVENTION (1) Field of the Invention

The present invention relates to an error-correction assistance system for allowing a display device to display an error such as an abnormality or a malfunction occurring at an apparatus including various drive mechanisms such as a workpiece processing mechanism and a workpiece transporting mechanism, and for assisting correction of the displayed error.

(2) Description of the Related Art

In an apparatus including various drive mechanisms such as a workpiece processing mechanism and a workpiece transporting mechanism and a process performed by the apparatus, there has been adopted a display system for notifying an operator of an error such as an abnormality or a malfunction occurring at each drive mechanism. For example, an IC transporting apparatus includes a display device capable of readily identifying a transport error occurrence site in course of transport of an IC among respective processing mechanisms from a loader to an unloader.

This display device schematically displays main processes performed by the respective processing mechanisms from the loader to the unloader, and allows a light emitting diode, corresponding to a process in which an error occurs, to flash. In addition, the display device displays a message about the error on a lower portion of a display region thereof (refer to, e.g., JP-A 06-148251 (FIG. 1 of the reference)).

However, a conventional display device has the following problems.

The conventional display device is effective at identifying a process in which an error occurs. However, the conventional display device only uses character information in order to notify an operator of a state of the error occurring at a drive mechanism in the process. This results in the following disadvantage: only a skilled operator can promptly identify an error occurrence site in the drive mechanism based on the character information.

In particular, as a result of advanced automation of an apparatus in recent years, an operator does not necessarily to manage the apparatus constantly. Consequently, skilled operators are reduced in number, so that unskilled operators must correct an error in many cases.

Therefore, the unskilled operators must correct an error while referring to a manipulation manual and the like. As a result, there arises a problem that it takes much time to correct an error.

SUMMARY OF THE INVENTION

The present invention is made in view of the aforementioned circumstances. It is therefore a principal object of the present invention to provide an error-correction assistance system capable of readily identifying an error occurrence site in a drive mechanism in a workpiece processing process or a workpiece transporting process, and efficiently correcting an error occurring at the error occurrence site.

In order to achieve the aforementioned object, the present invention adopts the following configuration.

An error-correction assistance system for assisting correction of an error including an abnormality and a malfunction occurring at a drive mechanism, comprising: display means for displaying information including actuation statuses of plural drive mechanisms; detection means for detecting an error occurring at at least any of the plural drive mechanisms, and transmitting a result of the detection in form of a detection signal; storage means for correlating details of errors occurring at the drive mechanism with details of the error detected by the detection means and image data of a drive mechanism where an error occurs, and storing the correlated details and image data as error information; error information selection means for selecting error information corresponding to the detection signal transmitted from the detection means, reading out the error information from the storage means, and allowing the display means to display an image based on details of an error and image data each contained in the error information; actuation status check means for allowing the display means to display a status whether or not the error occurrence site displayed by the error information selection means is actuated normally; and first image switch means for erasing display of an image representing the details of the error on the display means after the actuation status check means checks that the error occurrence site is actuated normally.

In the error-correction assistance system according to the present invention, the detection means detects an error occurring at each drive mechanism, and the error information selection means reads out details of the error and image data of an error occurrence site from the storage means based on a detection signal transmitted from the detection means. Then, the display means displays the details of the error and an image of the drive mechanism as the error information thus read out. Accordingly, it is possible to readily identify an error occurrence site based on contents displayed on the display means. That is, it is possible to readily identify an error occurrence site even when an operator is lacking in skills. Therefore, it is possible to perform error correction in a short time.

In addition, upon manipulating the actuation status check means after completion of error correction in an error occurrence site, an operator can readily check whether or not the site subjected to the error correction is in a normal actuation status while monitoring a screen of the display means. Further, when the actuation status check means checks that the error occurrence site is normally actuated, the first image switch means erases an image representing the details of the error displayed on the display means. That is, error correction is performed on an error occurrence site based on contents displayed on the display means and, then, an error correction status can be readily checked on the screen of the display means.

Preferably, the error-correction assistance system according to the present invention further comprises display control means, in a case of concurrent occurrence of errors at plural sites in one of a predetermined drive mechanism or plural drive mechanisms, for comparing details of the errors based on detection signals transmitted from respective detection means with each other, and allowing the display means to display a stack of images where an image representing details of the error with high priority is superimposed on an image representing details of the error with low priority in consideration of a procedure for error correction.

Herein, when the actuation status check means checks that the error occurrence site is actuated normally, the first image switch means erases the error information displayed on the display means, and allows the display means to sequentially display an image representing another error information in a lower layer.

With this configuration, in a case of occurrence of plural errors, the display control means allows the display means to initially display information about an error occurrence site where an error must be corrected preferentially. When error correction is performed in accordance with displayed details of the error and, then, the first image switch means is manipulated, the display means displays details of an error to be corrected preferentially in an error correction site. Accordingly, an operator can correct an error occurring at an error occurrence site in accordance with contents displayed on the screen of the display means without damage of a driving mechanism or a workpiece due to a wrong procedure. Further, the operator does not necessarily to develop an error correcting procedure for plural error occurrence sites.

Preferably, the error-correction assistance system according to the present invention is configured as follows.

The image data stored in the storage means includes first image data indicating a position of the detection means on an image representing a configuration of the drive mechanism, and second image data for highlight giving a warning of occurrence of an error while containing character information about the detection means detecting the error and character information of an error occurrence site detected by the detection means, The error-correction assistance system further comprises: image data creation means for utilizing the error information selected by the error information selection means to create paired image data in such a manner that a second image outputted and displayed based on the second image data is superimposed on a first image outputted and displayed based on the first image data; and second image switch means for switching an image to be displayed on the display means from the second image as an upper layer to the first image as a lower layer when the display means displays an image based on the image data created by the image data creation means.

Herein, when the actuation status check means is manipulated in a state that the second image switch means switches the image to be displayed on the display means to the first image, the detection means in the error occurrence site is actuated to check an operation of the error occurrence site, and in one of a case that the drive mechanism is in a normal actuation status and a case that the drive mechanism is yet in an error occurrence status, the position of the detection means displayed on the first image is highlighted.

With this configuration, when an error occurs at one of drive mechanisms, a second image as character information about details of the error is highlighted in the display means. When an operator manipulates the second image switch means to switch a screen of the display means from the second image to a first image, a position of detection means that detects the error is displayed on an image representing a configuration of a drive mechanism. Thus, it is possible to identify an error occurrence site more readily.

Further, when the operator manipulates the actuation status check means in a state that the display means displays the second image, the detection means checks whether or not the error occurrence site is actuated normally. Then, there is a highlighted position of detection means of a drive mechanism having an error displayed on the display means in one of a case of a normal state and a case of an error occurrence state. Accordingly, the operator does not necessarily to visually check an operation of the error occurrence site in a state that the drive mechanism is operated, and can readily check an operation state only by monitoring the display means. That is, the operator performs error correction in accordance with contents displayed on the display means without referring to a manipulation manual and the like. Therefore, it is possible to complete error correction in a short time without erroneous procedure.

Herein, the display means in the present invention is of a touch panel type that designates an image by a touch of a portion corresponding to a displayed image.

Each of the first image switch means and the second image switch means is provided as a graphical user interface at a predetermined portion on the image.

The actuation status check means is provided as a graphical user interface at a predetermined portion on the first image, and alternately switches between highlight and non-highlight each time an operator touches the graphical user interface provided at the predetermined portion on the first image.

With this configuration, all manipulations for check can be performed in an image display region of the display means. Thus, unnecessary operations are eliminated, so that processing work efficiency can be improved. In addition, a display mode is highlighted by manipulation of the switch means; therefore, it is possible to check that the display means is operated normally and to readily check whether or not the error occurrence site subjected to error correction is normal.

The character information about the error occurrence site may be a warning message indicating at least a name of the drive mechanism and details of the error in the drive mechanism. Alternatively, the character information about the error occurrence site may contain at least error numbers from among details of errors and error numbers correlated with the details of the errors, registered in one of a manipulation manual and an error collection manual.

In addition, the highlight of the position of the detection means displayed on the first image and the warning of the second image is a change in intensity of light on a corresponding portion.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Hereinafter, description will be given of one embodiment of the present invention with reference to the drawings.

In this embodiment, description will be given of, as an example, a case that a protective tape joining apparatus for joining a protective tape to a semiconductor wafer adopts an error-correction assistance system.

Figure 1:
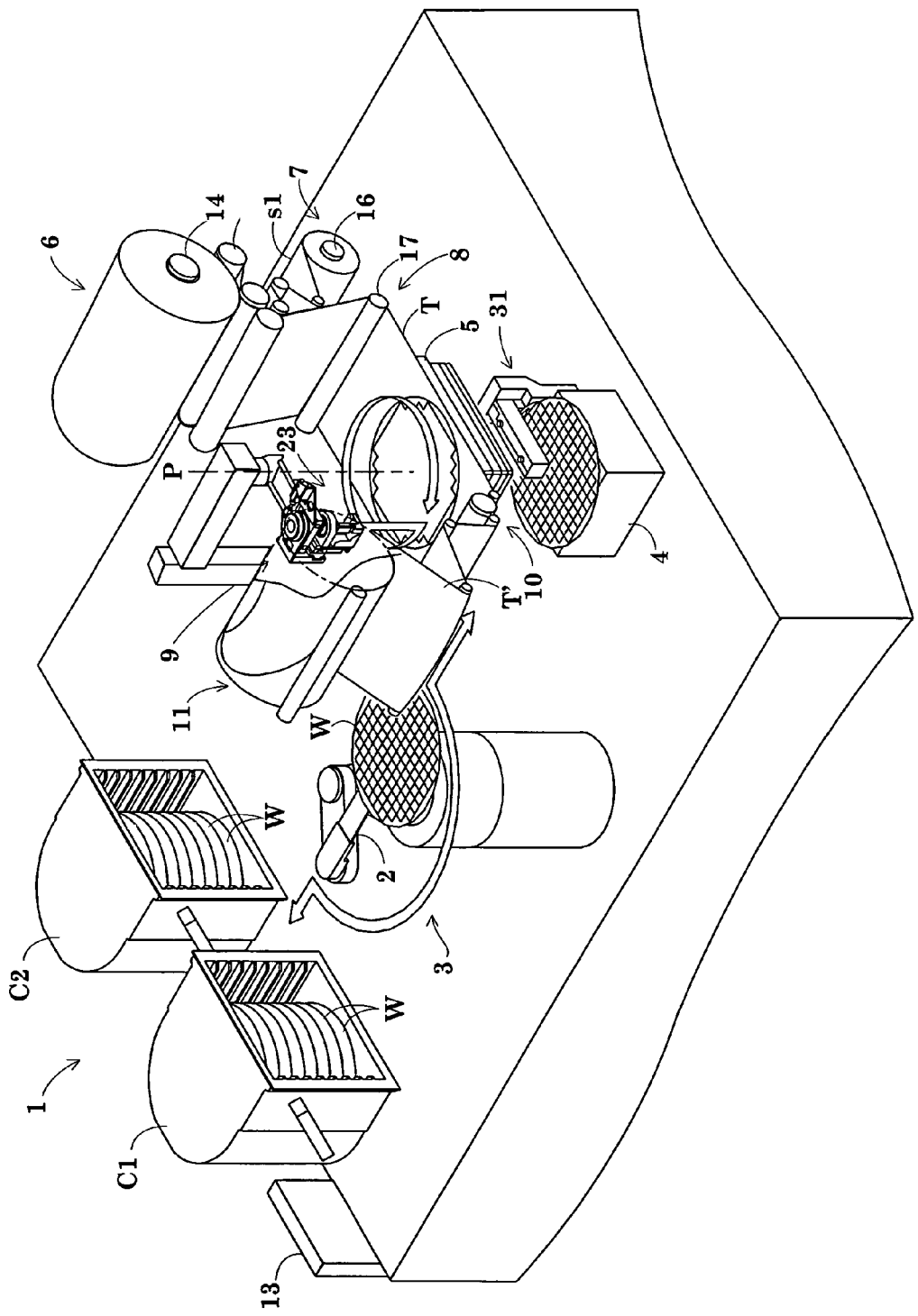
FIG. 1 is a perspective view illustrating a general configuration of a protective tape joining apparatus according to one embodiment of the present invention.

FIG. 1 is a perspective view illustrating a general configuration of the protective tape joining apparatus.

The protective tape joining apparatus comprises: a wafer supply/collection section 1 including a cassette C1 housing a semiconductor wafer (hereinafter, simply referred to as "wafer") W which is a target of joining and a cassette C2 housing a wafer W' having a protective tape T joined thereto; a wafer transporting mechanism 3 provided with a robot arm 2; an alignment stage 4; a chuck table 5 suction-holding a wafer W placed thereon; a tape supply section 6 supplying a protective tape T with a separator s1 toward the wafer W; a separator collection section 7 separating the separator s1 from the protective tape T supplied from the tape supply section 6, and collecting the separator s1; a joining unit 8 joining the protective tape T to the wafer W suction-held by and placed on the chuck table 5; a tape cutting mechanism 9 cutting the protective tape T joined to the wafer W along an outer periphery of the wafer W; a separating unit 10 separating an unnecessary tape T' from the cut protective tape T joined to the wafer W; a tape collection section 11 reeling and collecting the unnecessary tape T' separated by the separating unit 10; a manipulation section 13 accepting input of various protective tape joining parameters such as a tape supply speed; and the like. Hereinafter, description will be given of specific configurations of the respective structural sections and mechanisms.

In the wafer supply/collection section 1, the cassette C1 and the cassette C2 are arranged in parallel with each other. In the cassette C1, plural stacked wafers W each having a wiring pattern face directed upward are inserted and housed in a horizontal position. In the cassette C2, plural stacked wafers W' each having a protective tape T joined thereto are inserted and housed in a horizontal position. The wafer supply/collection section 1 has a sensor detecting a position of each of the cassette C1 and the cassette C2. In a case of failing to detect the position of each of the cassette C1 and the cassette C2, the sensor transmits a signal to a control section 25 (to be described later).

The robot arm 2 of the wafer transporting mechanism 3 can move forward/rearward in a horizontal direction and, also, can turn and move upward/downward as a whole. A horse shoe-shaped hold part of a vacuum suction type (not illustrated) is attached to a tip end of the robot arm 2. The hold part takes out one of stacked wafers W from the cassette C1 or C2, and transports the wafer W to each drive mechanism. Further, the hold part inserts a wafer W' having a protective tape T joined thereto in the cassette C1 or C2.

In this embodiment, the robot arm 2 takes out a wafer W from the cassette C1 and, then, transports the wafer W to the alignment stage 4, the chuck table 5 and the cassette C2 in this sequence. The robot arm 2 includes a drive part, a suction mechanism and the like, and has a sensor detecting an actuation status of the drive part, the suction mechanism or the like. This sensor transmits a detection signal to the control section 25 (to be described later).

Figure 3:
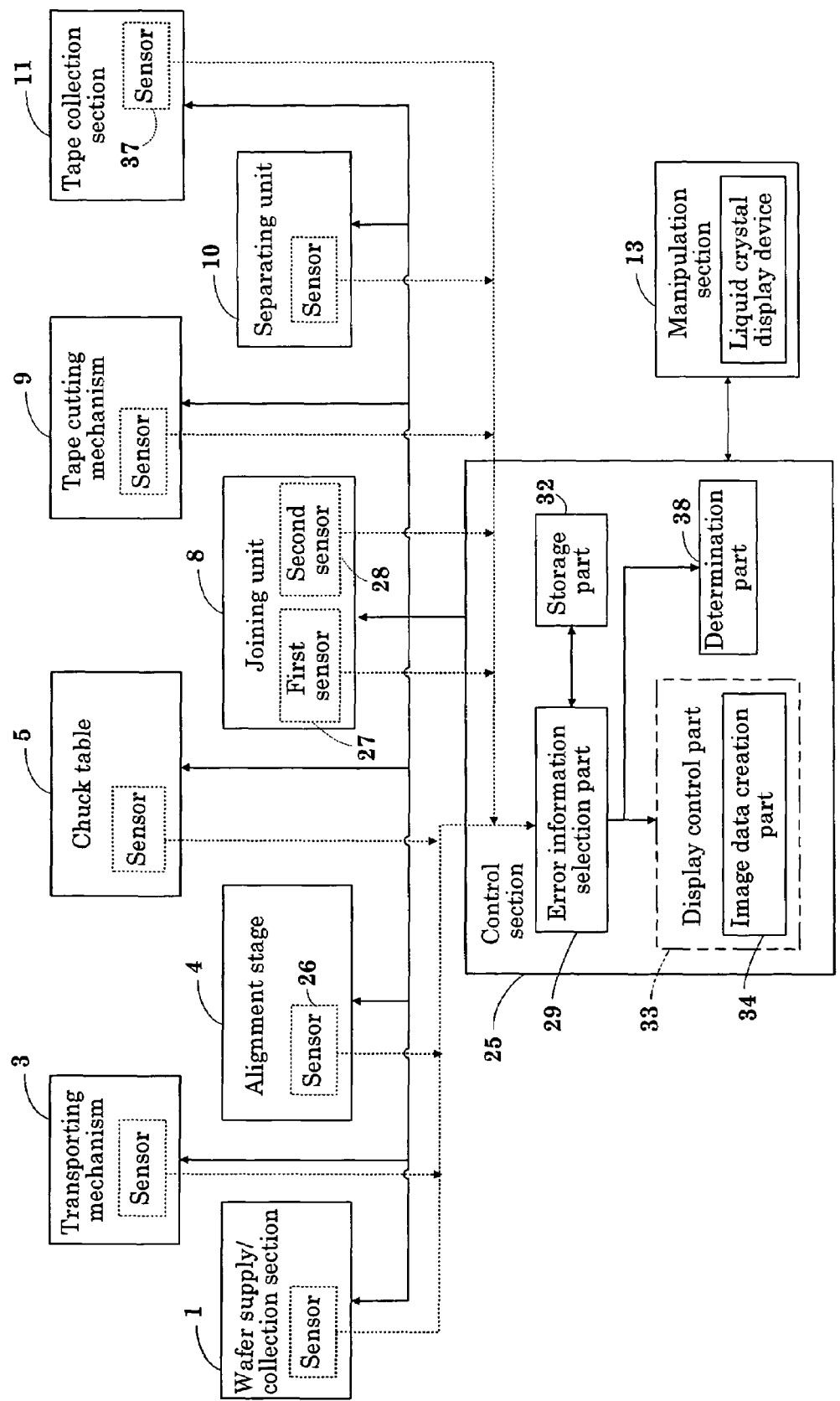
FIG. 3 is a block diagram illustrating an electrical configuration of the protective tape joining apparatus according to the embodiment.

The alignment stage 4 detects a position of a portion to be detected such as a V-shaped notch or an orientation flat formed in a peripheral edge of a wafer W, and performs alignment on the wafer based on a result of the detection. That is, as illustrated in FIG. 3, the alignment stage 4 has a sensor 26 detecting a position of a wafer W. The sensor 26 transmits a detection signal to the control section 25 (to be described later).

The chuck table 5 vacuum-sucks a wafer W transferred from the wafer transporting mechanism 3 and, then, placed thereon in a predetermined alignment position. On a top face of the chuck table 5, a cutter traveling groove is formed. In the cutter traveling groove, a cutter blade 12 of the tape cutting mechanism 9 (to be described later) turns along an outer periphery of a wafer W to cut a protective tape T joined to the wafer W. The chuck table 5 includes a suction mechanism, and has a sensor monitoring an actuation/stop status of the suction mechanism.

Figure 2:
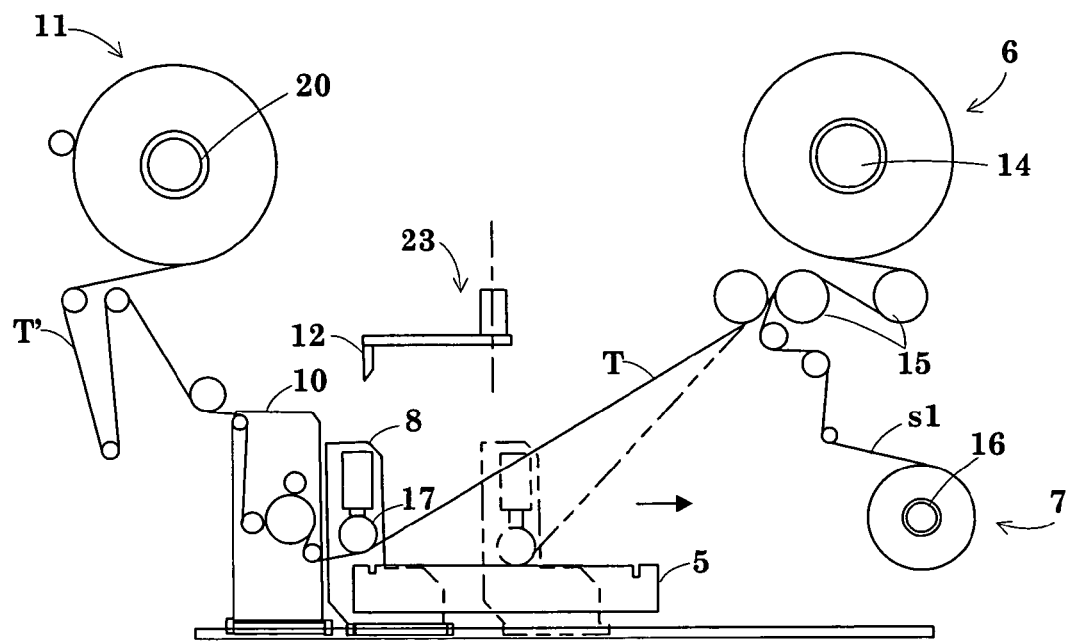
FIG. 2 is a side view illustrating a schematic configuration of a joining unit.

In the tape supply section 6, as illustrated in FIG. 2, a protective tape T with a separator s1 unreeled from a supply bobbin 14 is guided to a group of guide rollers 15 and, then, is guided to the joining unit 8 with the separator s1 separated therefrom. The supply bobbin 14 receives an appropriate rotational resistance, so that the protective tape T is prevented from being unreeled from the supply bobbin 14 excessively. The tape supply section 6 includes a drive mechanism unreeling the protective tape T, and the drive mechanism has a sensor monitoring an actuation/stop status thereof.

In the separator collection section 7, a collection bobbin 16 reeling the separator s1 separated from the protective tape T rotates in a tape reeling direction.

The joining unit 8 is provided with a joining roller 17 directed forward in a horizontal direction. Expansion/contraction of a cylinder allows the joining roller 17 to move upward/downward between an action position where the joining roller 17 presses a protective tape T against a wafer W to join the protective tape T to the wafer W and a standby position located above the action position. Further, a slide guide mechanism and a screwed-type drive mechanism (not illustrated) allow the joining roller 17 to reciprocate in a horizontal direction in FIG. 2. As illustrated in FIG. 3, the joining unit 8 has a set of a first sensor 27 and a second sensor 28 each detecting whether or not the joining roller 17 normally moves upward/downward between the standby position and the action position. Each of the first sensor 27 and the second sensor 28 transmits a detection signal to the control section 25 (to be described later).

The first sensor 27 located at the action position detects whether or not the joining roller 17 is normally positioned at a predetermined height before joining of a protective tape T to a wafer W.

The second sensor 28 located at the standby position detects whether or not the joining roller 17 returns to the standby position after joining of the protective tape T to the wafer W.

The separating unit 10 is provided with a separating roller 19 directed forward in a horizontal direction. A slide guide mechanism and a screwed-type drive mechanism (not illustrated) allow the separating roller 19 to reciprocate in the horizontal direction.

In the tape collection section 11, a collection bobbin 20 reeling an unnecessary tape T' rotates in a tape reeling direction. The tape collection section 11 has a reel sensor 37 detecting a rotation status of the collection bobbin 20 and, also, detecting whether or not the collection bobbin 20 becomes full of the unnecessary tape T'. The reel sensor 37 transmits a detection signal to the control section 25 (to be described later).

In the tape cutting mechanism 9, a pair of support arms each capable of turning about a vertical axis center P located on a center of the chuck table 5 are arranged in parallel with each other on a lower portion of a movable bench (not illustrated) capable of moving upward/downward. The cutter blade 12 having a blade end directed downward is attached to a cutter unit 23 provided at a free end side of the support arm. When the support arm 22 turns about the vertical axis center P, the cutter blade 12 travels along an outer periphery of a wafer W to cut a protective tape T joined to the wafer W.

The tape cutting mechanism 9 has a sensor detecting whether or not the cutter unit 23 normally moves upward/downward between an action position where the cutter blade 12 cuts a protective tape T and a standby position located above the action position, and a sensor monitoring a turn state of the support arm 22. Each of these sensors transmits a detection signal to the control section 25 (to be described later).

The manipulation section 13 is configured by a liquid crystal display device of a touch panel type, and includes an interface by which an operator performs manipulation through pictographic characters displayed on a screen (hereinafter, simply referred to as "GUI (Graphical User Interface)").

As illustrated in FIG. 3, the control section 25 collectively controls operations of the wafer supply/collection section 1, the transporting mechanism 3, the alignment stage 4, the chuck table 5, the joining unit 8, the tape cutting mechanism 9 and the tape collection section 11. In addition, the control section 25 receives signals transmitted from the respective sensors of these components, and monitors operation states of these components. Upon reception of an error signal indicating an abnormality from each sensor, the control section 25 reads out information from a storage part in accordance with details of the error, and allows the liquid crystal display device (the manipulation section 13) to display the information. A specific process performed by the control section 25 will be described later.

In this embodiment, the sensors of the respective components correspond to detection means according to the present invention.

Figure 4:
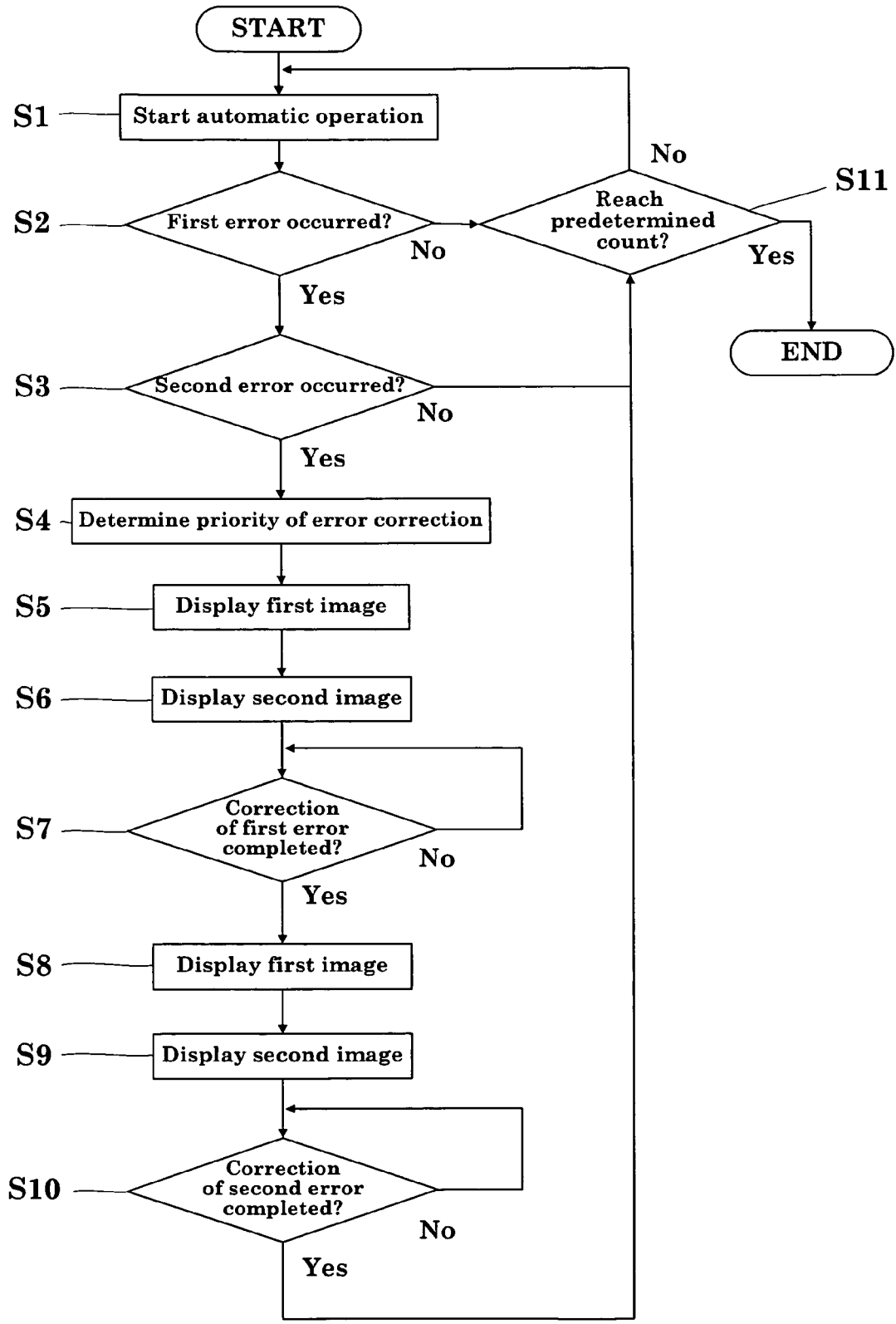
FIG. 4 is a flowchart showing an error displaying process.

With reference to FIG. 3 which is a block diagram illustrating the configuration of the protective tape joining apparatus, FIG. 4 which is a flowchart, and FIGS. 5 to 9 each of which illustrates a display screen, next, description will be given of a process, performed by the error-correction assistance system, for correcting an error such as an abnormality or a malfunction occurring at a part of a drive mechanism in course of joining of a protective tape T to a wafer W by the protective tape joining apparatus in this embodiment.

Upon completion of initial setting for the protective tape joining apparatus, the control section 25 issues an actuation command to the protective tape joining apparatus. Then, the wafer transporting mechanism 3 takes out a wafer W housed in the cassette C1 or C2, joins a protective tape T to the wafer W, and inserts the wafer W having the protective tape T joined thereto in the cassette C1 or C2. This process is automatically performed in a repetition manner (step S1).

More specifically, the robot arm 2 moves toward the cassette C1 or the cassette C2 of the wafer supply/collection section 1, and the hold part attached to the tip end of the robot arm 2 suction-holds and takes out a wafer W housed in the cassette C1 or C2. The robot arm 2 transfers the wafer W thus taken out to the alignment stage 4.

The alignment stage 4 performs alignment on the wafer W placed thereon. After completion of the alignment for the wafer W, the robot arm 2 suction-holds the wafer W and, then, transports the wafer W to the chuck table 5.

On the chuck table 5, the joining roller 17 of the joining unit 8 moves downward, and rolls on a protective tape T while pressing the protective tape T against a wafer W; thus, the protective tape T is joined to the wafer W. The joining roller 17 reaches a joining termination end and, then, moves upward. Thereafter, the cutter unit 23 of the tape cutting mechanism 9 is disposed at the action position, and the cutter blade 12 attached to the tip end of the cutter unit 23 cuts the protective tape T along an outer periphery of the wafer W. After completion of the cutting, the cutter unit 23 returns to the standby position.

When the cutter unit 23 returns to the standby position, the separating unit 10 moves rightward in FIG. 2 to separate an unnecessary tape T' from the protective tape T. When the separating unit 10 reaches a separation termination end, the separating unit 10 and the joining unit 8 return to respective joining start positions. Herein, the joining roller 17 is disposed at the standby position.

The wafer W having the protective tape T joined thereto is suction-held by the robot arm 2 and, then, is inserted in the cassette C1 or C2. In course of joining of the protective tape T to the wafer W, another wafer W is taken out from the cassette C1 or C2 by the robot arm 2 and is placed on the alignment stage 4. This process is performed in a repetition manner.

It is assumed herein that, in course of this process, a first error that the joining roller 17 erroneously moves upward/downward occurs (step S2) and, almost concurrently, a second error that the alignment stage 4 erroneously detects a position of a wafer W occurs (step S3). The sensors detecting the errors sequentially transmit error signals to an error information selection part 29 of the control section 25. In other words, details of an error are displayed on the screen of the liquid crystal display device 13 through the following process. In this embodiment, the error information selection part 29 corresponds to error information selection means according to the present invention.

In step S1, initially, the joining roller 17 moves downward from the standby position to the action position and, then, is ready to join a protective tape T to a wafer W. However, if the first sensor 27 fails to detect that the joining roller 17 moves downward to the action position within a predetermined time from a time point that the joining roller 17 starts to move downward, the first sensor 27 transmits an error signal to the error information selection part 29 of the control section 25.

The robot arm 2 places a wafer W on the chuck table 5 and, then, takes out a new wafer W from the cassette C1 to place it on a hold table 30 of the alignment stage 4.

Figure 5:
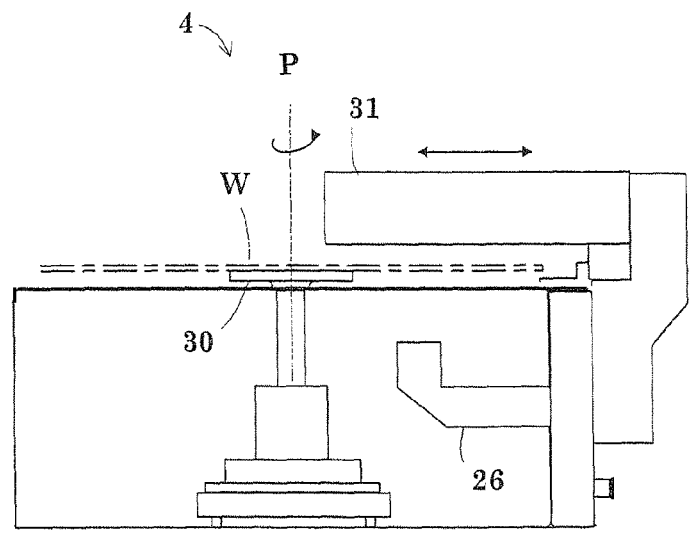
FIG. 5 is a side view illustrating a schematic configuration of an alignment stage.

When the robot arm 2 places the wafer W on the alignment stage 4, the hold table 30 of the alignment stage 4 rotates about a center vertical axis P while suction-holding the wafer W. During this rotation, the alignment stage 4 detects a notch of the wafer W. More specifically, as illustrated in FIG. 5, the sensor 26 which is a light receiving sensor is actuated when the hold table 30 rotates about the center vertical axis P, and receives a light beam emitted from a light source 31 located thereabove toward an outer periphery of the wafer W at a position where the sensor 26 is opposite to the light source 31 with the wafer W interposed therebetween. Accordingly, the control section 25 transmits a rotation drive signal to the hold table 30 and, concurrently, the sensor 26 is actuated, so that a signal indicating intensity of a light beam received by the sensor 26 is transmitted to the control section 25.

The control section 25 finds a position where the intensity of the light beam is changed from this signal based on a comparison operation. If failing to find the change in intensity as a result of this operation, the control section 25 determines that a rotation drive mechanism of the hold table 30 is erroneously actuated, and transmits an error signal to the error information selection part 29 (step S2).

The error information selection part 29 selects information from plural pieces of error information previously stored in a storage part 32 in accordance with the received error signals, and reads out the information from the storage part 32. That is, the storage part 32 previously stores details of errors and image data indicating error occurrence sites, determined based on error signals transmitted from the respective sensors of the drive mechanisms (step S3). In this embodiment, the storage part 32 corresponds to storage means according to the present invention.

The two pieces of error information read out by the error information selection part 29 are sent to a display control part 33. The display control part 33 corresponding to display control means according to the present invention determines which error must be preferentially corrected. In this case, for example, the display control part 33 acquires information about current positions of drive mechanisms from the respective sensors of the drive mechanisms, and determines priority of errors so as to avoid that the drive mechanisms are damaged due to contact with each other. In this embodiment, the display control part 33 determines that the error occurring at the joining roller 17 is higher in priority than the error occurring at the alignment stage 4 (step S4).

Figure 6:
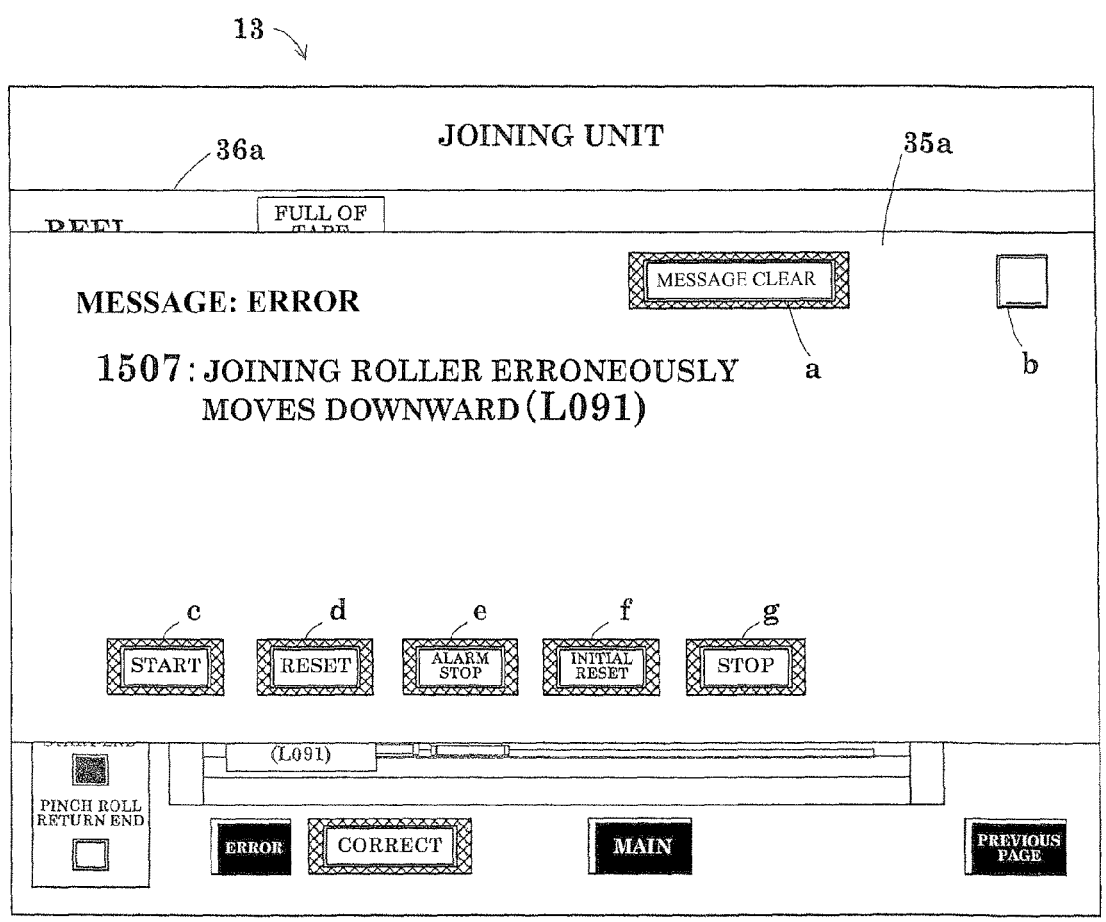
FIG. 6 illustrates a first image representing details of a first error.

After the determination of the priority of error display, the display control part 33 sends information about the priority to an image data creation part 34. Based on the error information and the priority information stored in the storage part 32, the image data creation part 34 creates, for each error signal, a set of images: a first image representing an error warning displayed in form of characters and a second image representing a schematic configuration of a drive mechanism where an error occurs. As illustrated in FIG. 6, a first image 35a to be displayed on the screen of the liquid crystal display device 13 represents a character, "ERROR", an error number (1507 in FIG. 6), a character string, "JOINING ROLLER ERRONEOUSLY MOVES DOWNWARD" indicating an error occurrence site and details of an error, and a number of a sensor that detects the error (L091), each highlighted in red. The error number is registered because an operator who wants to know more specific details of an error can refer to a manipulation manual or an error correction manual based on the number.

Figure 7:
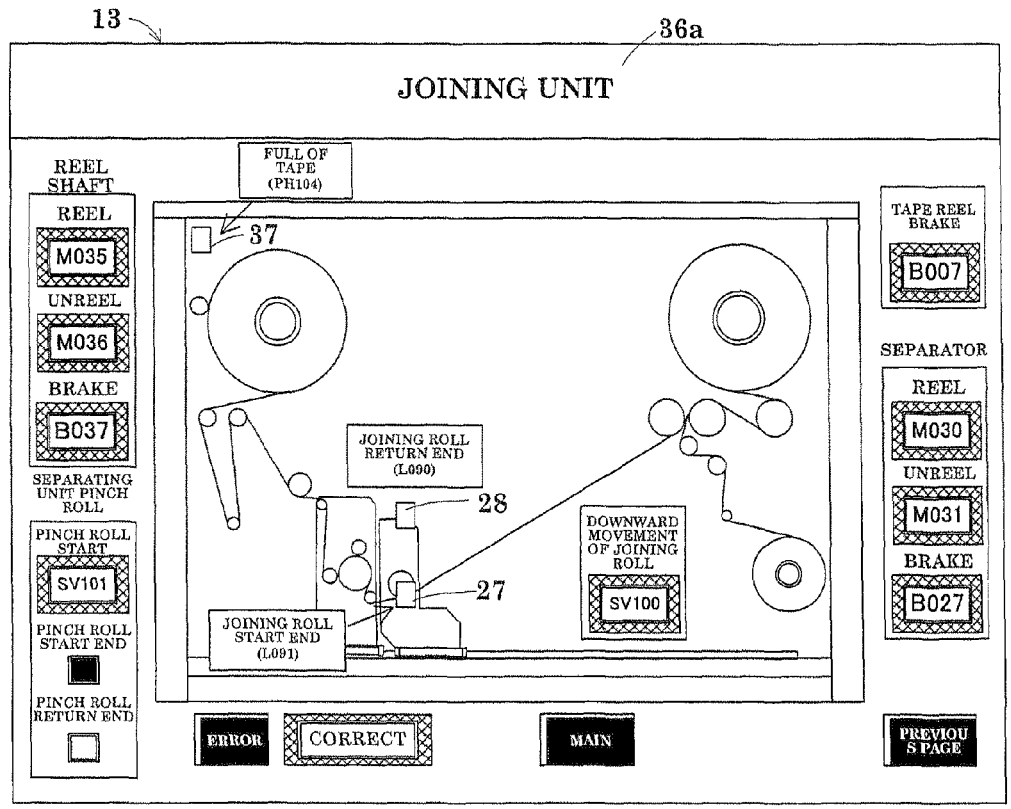
FIG. 7 illustrates a second image representing the details of the first error.

Further, plural GUIs "a" to "g" are provided on this screen. If the operator touches one of the GUIs, the screen is switched to a screen displaying appropriate information. If the operator touches the GUI "a", "MESSAGE CLEAR", provided on a right upper portion of the screen, the first image 35a is switched to a second image 36a representing a schematic configuration of a drive mechanism where an error occurs and positions of respective sensors in drive mechanisms, as illustrated in FIG. 7. The GUI "a", "MESSAGE CLEAR", functions as second image switch means according to the present invention.

Specifically, the screen displays the configuration of the joining unit 8 at a center. Herein, there are displayed the first sensor 27 and the second sensor 28 in the joining roller 17 and the sensor 37 detecting that the collection bobbin 20 becomes full of an unnecessary tape T'. These sensors are displayed in white because the joining unit 8 stops due to occurrence of the error. If each drive mechanism normally operates, these sensors are highlighted in red, for example.

The screen also displays names and code numbers of respective drive portions at both sides. The code numbers are displayed as GUIs, respectively (step S5).

The operator looks at the position of the joining roller 17 where the error occurs and the position of the first sensor 27 in the second image 36a to identify an error occurrence site, and corrects the error (step S6).

After completion of the error correction, the operator selects and touches a GUI, "CORRECT", from among GUIs, "ERROR", "CORRECT", "MAIN", "PREVIOUS PAGE", provided on a lower portion of the screen of the liquid crystal display device 13. This GUI is alternately switched between highlight in red and non-highlight in white each time the operator touches. More specifically, when the operator touches the GUI, the control section 25 transmits an actuation signal to the joining unit 8, so that the joining unit 8 is actuated. Concurrently, when the respective drive portions are actuated normally, the sensors are highlighted in red. If the second sensor 36 that detects an error occurrence site is not highlighted after the operator touches the GUI, "CORRECT", the error is not corrected completely. Accordingly, error correction and check are performed in a repetition manner (step S7). The GUI, "CORRECT", corresponds to actuation status check means according to the present invention.

Figure 8:
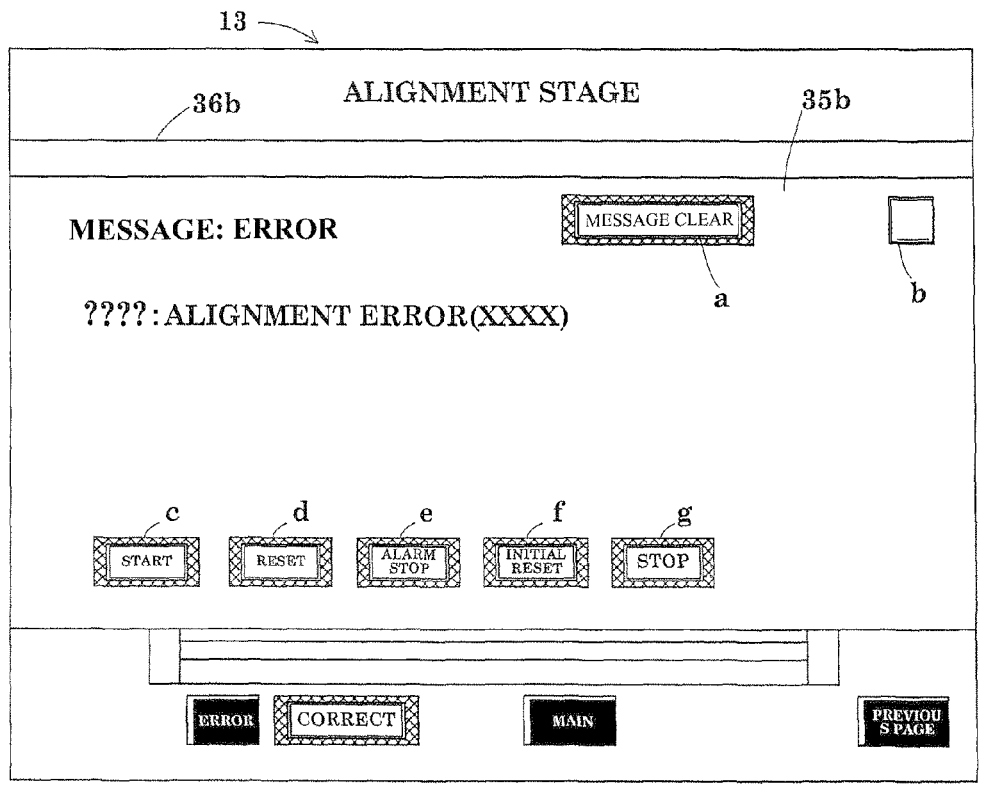
FIG. 8 illustrates a first image representing details of a second error.
Figure 9:
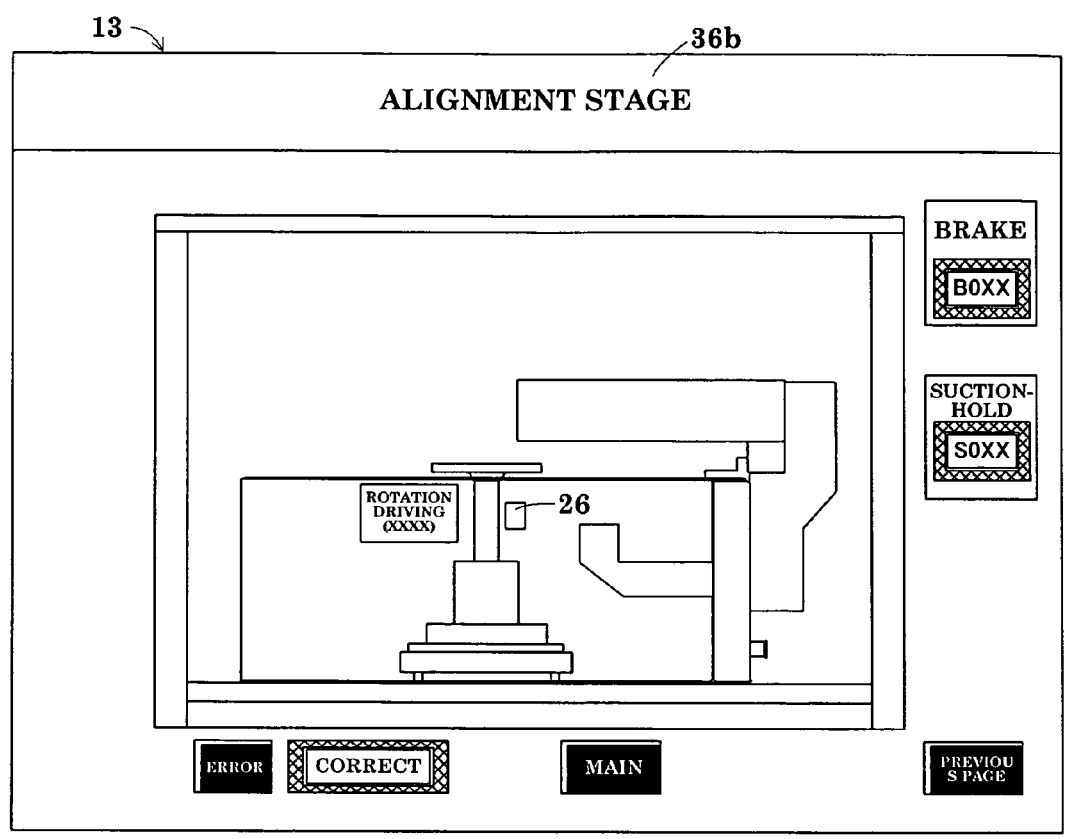
FIG. 9 illustrates a second image representing the details of the second error.

When the operator checks completion of the correction of the error that the joining roller 17 erroneously moves downward, a determination part 38 of the control section 25 erases the screen displaying the details of the error in the joining unit 8 after lapse of a predetermined time, for example, after a few seconds, and subsequent details of an error are displayed on the screen of the liquid crystal display device 13. That is, as illustrated in FIG. 8, the screen displays a first image 35b representing a character of "ERROR", an error number, an error occurrence site, details of an error, and a number of a sensor that detects the error, each highlighted in red (step S8).

As in step S5, when the operator touches a GUI "a","MESSAGE CLEAR", the screen displays a second image 36b representing the configuration of the alignment stage 4 and the position of the sensor. The operator identifies an error occurrence site based on the second image 36b, and corrects the error (step S9).

After completion of the error correction, the operator touches a GUI, "CORRECT", provided on a lower portion of the screen of the liquid crystal device 13 to check whether or not the error is corrected completely. If the error is corrected completely, the determination part 38 erases the details of the error displayed on the screen of the liquid crystal display device 13 after a few seconds. Then, the screen is switched to a screen displaying a normal automatic operation state, and an operation for automatically joining a protective tape T to a wafer W is started. Thereafter, the operator checks whether the number of wafers W each having a protective tape T joined thereto reaches a predetermined count (step S10). If the number of wafers W reaches the predetermined count, the automatic joining operation is finished. If not, the automatic joining operation is continuously performed. Thus, the process for displaying an error warning and the process for correcting an error each performed upon occurrence of an error are finished. The determination part 38 functions as first image switch means according to the present invention.

As described above, if an error such as an abnormality or a malfunction occurs at any of the drive mechanisms, the screen of the liquid crystal display device 13 displays the first image representing details of the error in form of character information and the sensor that detects the error. After check of the details of the error in the first image, the screen is switched from the first image to the second image as a lower layer, so that an error occurrence site is shown in the image representing the configuration of the drive mechanism. Therefore, even an unskilled operator can readily identify the error occurrence site.

The operator corrects the error in the error correction site and, then, touches the GUI, "CORRECT", displayed on the screen of the liquid crystal display device 13. Thus, the drive mechanism is actuated, and the sensor of the error occurrence site checks an operation of the error occurrence site subjected to error correction. As a result of this check, if the error is corrected completely, a portion corresponding to the sensor is highlighted. Therefore, the operator does not have to visually check whether or not the error correction in the drive device is normally completed. That is, the operator can readily check details of an error and completion of error correction only by manipulation of the liquid crystal display device 13.

If plural errors occur concurrently or almost concurrently, priority of each error is determined so as to avoid collision or interference of drive portions with each other in course of error correction. Then, an error with high priority is sequentially displayed on the screen of the liquid crystal display device 13. If the error is corrected in accordance with the details of the error, drive portions and the like are not damaged. Thus, the error can be corrected efficiently. In addition, the operator only checks details displayed on the screen and performs various manipulations on the screen. Therefore, the operator does not necessarily to refer to a manipulation manual and the like. In other words, even an unskilled operator can correct an error without fail. Thus, it is possible to reduce a time for the process and improve workability.

The present invention may be effected in the following manners.

(1) In this embodiment, if errors concurrently occur at plural sites, an error display order is determined in consideration of priority of error correction; however, the present invention is not limited to thereto. For example, an error display order may be an order of occurrence of an error.

(2) In this embodiment, the protective tape joining apparatus adopts the error-correction assistance system. However, the error-correction assistance system may be applied to another apparatus including drive mechanisms.

(3) In this embodiment, when the GUI, "CORRECT", in the second image is touched, the screen on the liquid crystal display device 13 returns to the screen for automatic operation based on the command of the determination part 38 after lapse of the predetermined time. However, a GUI may be provided in order that the screen on the liquid crystal display device 13 can automatically return to the screen for automatic operation through the manipulation by the operator independently of the determination by the determination part 38.

(4) In this embodiment, display of details of an error is finished each completion of correction of the error displayed on the screen. However, the present invention may adopt the following configuration.

For example, even when the screen of the liquid crystal display device 13 displays a subsequent error after completion of an error, if an operator touches a GUI, "PREVIOUS PAGE", provided at a right lower portion of the screen, details of the corrected error can be checked retroactively.

The present invention may be embodied in other specific forms without departing from the spirit or essential attributes thereof and, accordingly, reference should be made to the appended claims, rather than to the foregoing specification, as indicating the scope of the invention.

What is claimed is:

1. An error-correction assistance system for assisting correction of an error including an abnormality and a malfunction occurring at a drive mechanism provided in a protective tape joining apparatus for joining a protective tape to a semiconductor wafer, comprising;
   a sensor provided in a wafer supply/collection section to transmit a signal when a position of each of plural cassettes fails to be detected;
   a sensor provided in a robot arm to detect an actuation status of a drive part and a suction mechanism;
   a sensor provided in an alignment stage to detect a position of the semiconductor wafer;
   a sensor provided in a chuck table to monitor an actuation/stop status of the suction mechanism;
   a sensor in a tape supply unit to monitor an actuation/stop status of a drive mechanism unreeling the protective tape;
   a first sensor and a second sensor in a joining unit each to detect whether or not a joining roller normally moves upward/downward between a standby position and an action position;
   a reel sensor to detect a rotation status of a collection bobbin and to detect whether or not the collection bobbin becomes full of an unnecessary tape;
   a sensor in a tape cutting mechanism to detect whether or not a cutter unit normally moves upward/downward between an action position to cut the protective tape and a standby position located above, and a sensor to monitor a turn state of a support arm;
   a display unit for displaying information including actuation statuses on positions of the sensors;
   a storage unit for correlating details of errors occurring at the sensors with details of the error detected by the sensors and image data of a drive mechanism where an error occurs, and storing the correlated details and image data as error information;
   an error information selection unit for selecting error information corresponding to the detection signal transmitted from the sensors, reading out the error information from the storage unit, and allowing the display unit to display an image based on details of an error and image data each contained in the error information;
   an actuation status check unit for allowing the display unit to display a status whether or not the error occurrence site displayed by the error information selection unit is actuated normally;
   a first image switch unit for erasing display of an image representing the details of the error on the display unit after the actuation status check unit checks that the error occurrence site is actuated normally, and
   a display control unit, in a case of concurrent occurrence of errors at plural sites in one of a predetermined drive mechanism or plural drive mechanisms, for comparing details of the errors based on detection signals transmitted from respective sensors with each other, and allowing the display unit to display a stack of images where an image representing details of the error with high priority is superimposed on an image representing details of the error with low priority in consideration of a procedure for error correction,
   wherein when the actuation status check unit checks that the error occurrence site is normally actuated, the first image switch unit erases the error information displayed on the display unit, and allows the display unit to sequentially display an image representing another error information in a lower layer, and
   wherein said drive mechanism starts operating when said actuation status check unit checks correction of the error occurrence site.

2. The error-correction assistance system according to claim 1, wherein
   the image data stored in the storage unit includes first image data indicating a position of the sensors on an image representing a configuration of the drive mechanism, and second image data that is highlighted when an error occurs and contains character information about the sensors detecting the error and character information of an error occurrence site detected by the sensors,
   the error-correction assistance system further comprising:

image data creation unit for utilizing the error information selected by the error information selection unit to create paired image data in such a manner that a second image outputted and displayed based on the second image data is superimposed on a first image outputted and displayed based on the first image data; and second image switch unit for switching an image to be displayed on the display unit from the second image as an upper layer to the first image as a lower layer when the display unit displays an image based on the image data created by the image data creation unit, wherein when the actuation status check unit is manipulated in a state that the second image switch unit switches the image to be displayed on the display unit to the first image, the sensor in the error occurrence site is actuated to check an operation of the error occurrence site, and in one of a case that the drive mechanism is in a normal actuation status and a case that the drive mechanism is yet in an error occurrence status, the position of the sensor displayed on the first image is highlighted.

3. The error-correction assistance system according to claim 2, wherein the display unit is of a touch panel type that designates an image by a touch of a portion corresponding to a displayed image, each of the first image switch unit and the second image switch unit is provided as a graphical user interface at a predetermined portion on the image, and the actuation status check unit is provided as a graphical user interface at a predetermined portion on the first image, and alternately switches between highlight and non-highlight each time an operator touches the graphical user interface provided at the predetermined portion on the first image.

4. The error-correction assistance system according to claim 2, wherein the character information about the error occurrence site is a warning message indicating at least a name of the drive mechanism and details of the error in the drive mechanism.

5. The error-correction assistance system according to claim 2, wherein the character information about the error occurrence site contains at least error numbers from among details of errors and error numbers correlated with the details of the errors, registered in one of a manipulation manual and an error collection manual.

6. The error-correction assistance system according to claim 2, wherein each of the highlight on the second image and the highlight of the position of the sensors displayed on the first image is a change in color on a portion indicating the sensor.

7. The error-correction assistance system according to claim 2, wherein the highlight of the position of the sensor displayed on the first image and the warning of the second image is a change in intensity of light on a corresponding portion.

* * * * *